US011915996B2

(12) United States Patent
Sankman et al.

(10) Patent No.: US 11,915,996 B2
(45) Date of Patent: Feb. 27, 2024

(54) MICROELECTRONICS ASSEMBLY INCLUDING TOP AND BOTTOM PACKAGES IN STACKED CONFIGURATION WITH SHARED COOLING

(71) Applicant: Intel Corporation, Santa Clara, CA (US)

(72) Inventors: Robert Sankman, Phoenix, AZ (US); Md Altaf Hossain, Portland, OR (US); Ankireddy Nalamalpu, Portland, OR (US); Dheeraj Subbareddy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 950 days.

(21) Appl. No.: 16/407,587

(22) Filed: May 9, 2019

(65) Prior Publication Data

US 2020/0357721 A1 Nov. 12, 2020

(51) Int. Cl.
| | |
|---|---|
| *H01L 23/427* | (2006.01) |
| *H01L 23/31* | (2006.01) |
| *H01L 23/367* | (2006.01) |
| *H01L 23/433* | (2006.01) |
| *H01L 23/538* | (2006.01) |
| *H01L 25/065* | (2023.01) |
| *H01L 23/00* | (2006.01) |

(52) U.S. Cl.
CPC ........ *H01L 23/427* (2013.01); *H01L 23/3157* (2013.01); *H01L 23/367* (2013.01);
(Continued)

(58) Field of Classification Search
CPC . H01L 23/427; H01L 23/367; H01L 23/3157; H01L 23/433; H01L 23/5385;
(Continued)

(56) References Cited

U.S. PATENT DOCUMENTS

| | | |
|---|---|---|
| 4,327,399 A | 4/1982 | Sasaki et al. |
| 4,970,575 A | 11/1990 | Soga et al. |

(Continued)

FOREIGN PATENT DOCUMENTS

| | | |
|---|---|---|
| WO | 9815978 | 4/1998 |
| WO | 2017105421 | 6/2017 |

OTHER PUBLICATIONS

"Rugged, High-Speed, High-Cycle Connectors, Edge Rate®", retrieved from the Internet: https://www.samtec.com/connectors/backplane/micro-backplane-systems [copy retrieved Apr. 16, 2019], 13 pages.
(Continued)

*Primary Examiner* — Quoc D Hoang
(74) *Attorney, Agent, or Firm* — Schwabe, Williamson & Wyatt, P.C.

(57) ABSTRACT

An integrated circuit structure that includes a first integrated circuit package and a second integrated circuit package is described. The two packages can be stacked above, for example, a printed circuit board. The top package is inverted, such that a first die of that top package is facing a second die of the bottom package. A cooling arrangement is in a gap between the first and second integrated circuit packages, and is thermally coupled to the first and second die. The cooling arrangement is to transfer heat generated by a first die of the first integrated circuit package and a second die of the second integrated circuit package. In some cases, structures comprising electrically conductive material (e.g., metal) are encapsulated by a molding compound or insulator, and extend between a first substrate of the first integrated circuit package and a second substrate of the second integrated circuit package.

20 Claims, 9 Drawing Sheets

(52) U.S. Cl.
CPC ........ *H01L 23/433* (2013.01); *H01L 23/5385* (2013.01); *H01L 23/5386* (2013.01); *H01L 23/5387* (2013.01); *H01L 23/5389* (2013.01); *H01L 25/0652* (2013.01); *H01L 24/16* (2013.01); *H01L 2224/16225* (2013.01)

(58) Field of Classification Search
CPC ............. H01L 23/5386; H01L 23/5387; H01L 23/5389; H01L 23/0653; H01L 25/0652
USPC ........................................................ 257/692
See application file for complete search history.

(56) References Cited

U.S. PATENT DOCUMENTS

| | | | |
|---|---|---|---|
| 9,698,132 B1* | 7/2017 | Ady | .................... H01L 23/3736 |
| 10,186,499 B2 | 1/2019 | Seidemann et al. | |
| 2008/0303138 A1 | 12/2008 | Flett | |
| 2014/0209285 A1 | 7/2014 | Hoshino et al. | |
| 2016/0148902 A1* | 5/2016 | Chen | ....................... H01L 25/50 438/107 |
| 2017/0207204 A1* | 7/2017 | Lin | ....................... H01L 25/105 |
| 2017/0263530 A1 | 9/2017 | Schleicher | |
| 2019/0333836 A1* | 10/2019 | Lin | ................... H01L 23/49816 |
| 2020/0126890 A1* | 4/2020 | Singh | .................... H01L 23/427 |
| 2020/0381330 A1* | 12/2020 | Chiu | ................. H01L 23/49838 |

OTHER PUBLICATIONS

Extended European Search Report received for EP Application No. 20162627.2, dated Jun. 12, 2020. 9 pages.
Office Action from European Patent Application No. 20162627.2, dated Feb. 17, 2022, 8 pgs.
Notice of Allowance from European Patent Application No. 20162627. 2, dated Mar. 9, 2023, 8 pgs.

* cited by examiner

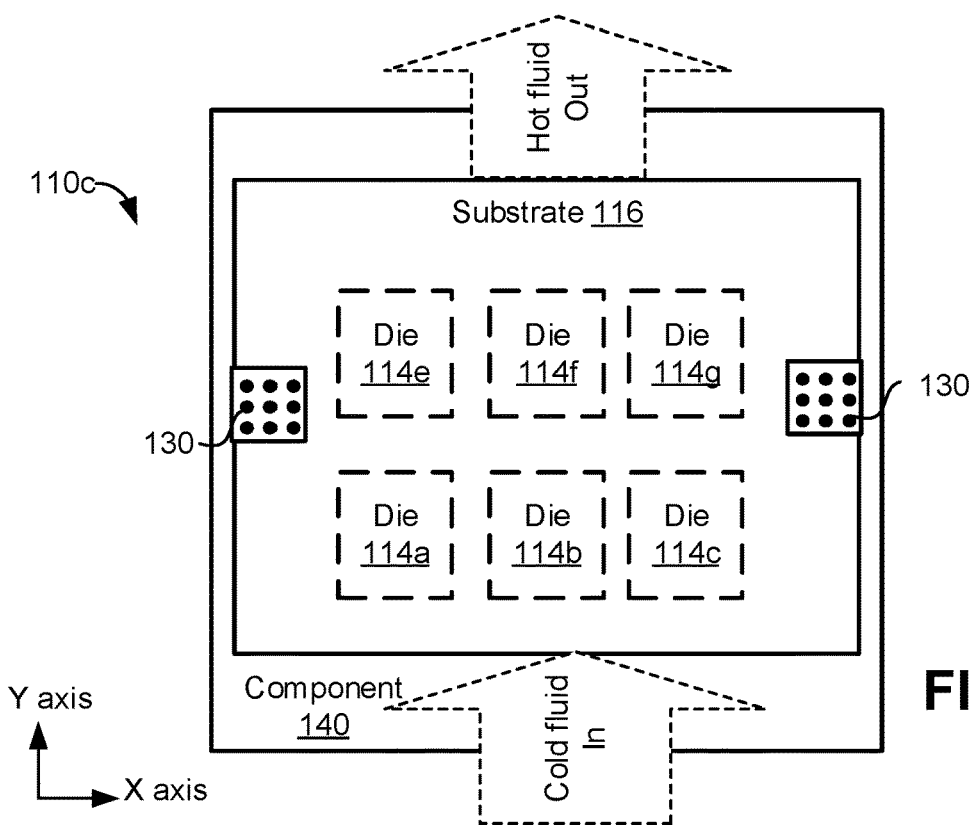
FIG. 3C1
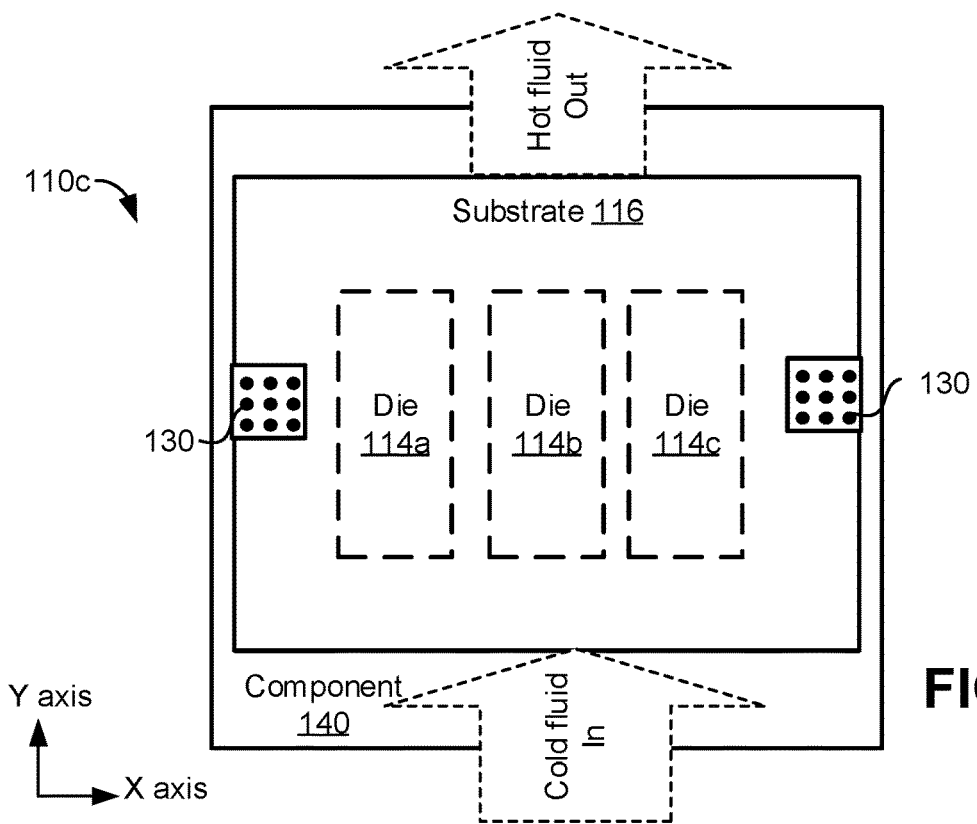
FIG. 3C2

MICROELECTRONICS ASSEMBLY INCLUDING TOP AND BOTTOM PACKAGES IN STACKED CONFIGURATION WITH SHARED COOLING

BACKGROUND

Integrated circuitry continues to scale to smaller feature dimensions and higher packaging densities. With such scaling, the density of power consumption of a given microelectronic device within a given package tends to increase, which, in turn, tends to increase the average junction temperature of transistors of that device. If the temperature of the microelectronic device becomes too high, the integrated circuits in the device may be damaged or otherwise suffer performance issues (e.g., sub-optimal performance such as low gain or slow switching speeds, or catastrophic failure where one or more portions of the integrated circuitry is destroyed). This issue is exacerbated when multiple microelectronic devices are incorporated in close proximity to one another in a in a stacked-die configuration. Thus, thermal transfer solutions, such as integrated heat spreaders, must be utilized to remove heat from such microelectronic devices. There are a number of non-trivial and unresolved issues associated with thermal management.

Figure 1:
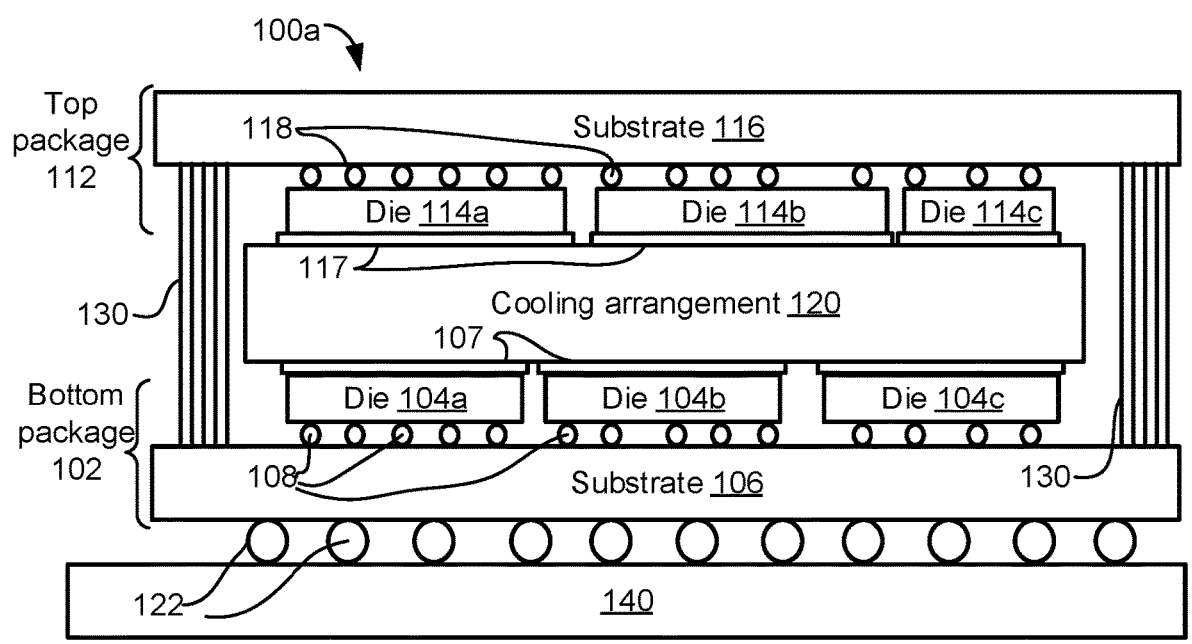
FIG. 1 illustrates a cross-sectional view of an integrated circuit structure that includes a shared cooling arrangement, where the cooling arrangement dissipates heat from one or more dies of a top package and from one or more dies of a bottom package, in accordance with an embodiment of the present disclosure.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming an integrated circuit structure that includes multiple vertically stacked electronic component packages and a thermal management solution that is shared by two or more of the packages. In one such embodiment, two electronic component packages are arranged in an inverted stacked configuration, such that the die of one package is facing the die of the other package. In addition, a cooling arrangement is between and in thermal contact with both packages, such that the cooling arrangement provides necessary cooling to both the packages. In some cases, the two packages have vertical interconnections therebetween, which are used for communication between the two packages. In an example, the cooling arrangement comprises a fluid cold plate, such as a micro-channel fluid cold plate (although in some such examples, the channels of the cold plate may be wider than a micro-channel cold plate). In another example, the cooling arrangement comprises one or more heat pipes. In yet another example, the cooling arrangement comprises one or more heat spreaders, fins, and/or other heat absorption and dissipation mechanisms. The present disclosure is not intended to be limited by a type of cooling arrangement, and any appropriate type of cooling arrangement may be implemented.

General Overview

As noted above, a number of non-trivial and unresolved issues are associated with thermal management solutions for integrated circuitry, particularly with respect to integrated circuit packages that include multiple die, one or more of which requires very high-power. In such cases, for example, even a single processor may consume very high-power (e.g., on the order of tens, or even hundreds of Watts). Heat generated from the consumption of power has to be removed effectively for proper operation of the system. Thus, thermal management is necessary. Unfortunately, current thermal management and packaging solutions generally require a relatively large package form factor. For instance, consider the case where multiple packages are arranged in a side-by-side configuration on a printed circuit board. In some case, each package is assigned its own cooling arrangement, while in other cases a given cooling arrangement can extend over multiple packages. In any such cases, arranging the packages in the side-by-side configuration takes considerable area of the circuit board in the X-Y plane. Exacerbating this problem is that some applications are further constrained in the Z-plane (e.g., ultrathin laptops).

Thus, according to an embodiment of the present disclosure, a microelectronics assembly is provided that includes vertically stacked electronic component packages and a shared thermal management solution. The overall structure provides a relatively efficient form factor. An integrated circuit package can include a packaging substrate, one or more dies, and interconnections between the die and the packaging substrate. In some embodiments of the present disclosure, two such packages may be stacked on top of each other (e.g., stacked "vertically") on a printed circuit board or mother board. For the sake of convenience, the package on the circuit board is termed herein as a "bottom" package, and the package stacked on the bottom package is termed herein as a "top" package. However, as will be readily apparent in light of this disclosure, the terms "top" "bottom" "vertically" "upper" "lower" and other such terms indicative of spatial relationship do not necessarily indicate an absolute positioning of these packages. For instance, in some configurations of the integrated circuit structure, the top package may actually be at a vertically lower elevation than the bottom package. To this end, such spatial relationship terms are to facilitate identification of the packages for a given depiction of the structure.

In various embodiments, the packages are stacked vertically, such that the overall combined footprint of the two packages on the circuit board (e.g., in the X-Y plane) is reduced (e.g., compared to arranging the packages in the side-by-side configuration). In addition, one package is inverted with respect to the other package, so that the die of each package are facing each other. This allows for a single thermal solution to be positioned between and shared by the top and bottom packages. This results in an efficient form factor for the overall integrated circuit structure.

As noted, the cooling arrangement is disposed between the top and bottom packages, where the cooling arrangement provides necessary cooling to both the packages. For example, the bottom package has a substrate and one or more dies attached to the substrate. The back sides of the one or more dies of the bottom package (e.g., a side of the dies that is opposite to a side attached to the substrate) faces the cooling arrangement, and are thermally coupled to the cooling arrangement (e.g., via one or more thermally conductive bonding material, such as a thermal interface material). Similarly, the top package has a substrate and one or more dies attached to the substrate. The back sides of the one or more dies of the top package faces the cooling arrangement, and are thermally coupled to the cooling arrangement (e.g., via one or more thermally conductive bonding material, such as a thermal interface material).

In some embodiments, the two packages may have vertical interconnections therebetween (e.g., extending from a substrate of the top package to a substrate of the bottom package), which are used for communication between the two packages. The interconnections may be arranged, for example, along the periphery of the cooling arrangement, and in some such cases are encapsulated by insulating material, such as molding compound. The interconnections can be implemented with any number of interconnect schemes, such as ribbon cables and connectors, wire bonding, or interlayer dielectric structures that have conductive pathways therein.

The cooling arrangement may be any appropriate type of cooling arrangement, as will be appreciated. For example, in some embodiments the cooling arrangement comprises fluid cold plate, e.g., micro-channel fluid cold plate (although in some examples, the channels of the cold plate may be wider than micro-channels). In another example embodiment, the cooling arrangement comprises one or more heat pipes. In yet another example embodiment, the cooling arrangement comprises heat spreaders, fins, and/or other heat absorption and dissipation mechanism. Many variations will be apparent in light of this disclosure.

Architectures

FIG. 1 illustrates a cross-sectional view of an integrated circuit structure 100a (also referred to as structure 100a) that includes a shared cooling arrangement 120 (also referred to as arrangement 120), where the arrangement 120 dissipates heat from one or more dies 114a, 114b, 114c of a top package 112 and from one or more dies 104a, 104b, 104c of a bottom package 102, and where the bottom package 102 includes interconnect structures 122 for coupling to a substrate 140, in accordance with an embodiment of the present disclosure. The top package 112 and the bottom package 102 may be generally referred to herein as integrated circuit packages or microelectronics packages.

The bottom package 102 includes a package substrate 106. The substrate 106 is populated with a number of integrated circuits thereon in the form of one or more die, e.g., dies 104a, 104b, 104c. The substrate 106 can be any standard or proprietary package, but in some example cases is standard ceramic package or an epoxy-based laminate substrate having a core and/or build-up layers.

Elements referred to herein with a common reference label followed by a particular number or alphabet may be collectively referred to by the reference label alone. For example, dies 104a, 104b, 104c may be collectively and generally referred to as dies 104 in plural, and die 104 in singular. Although the bottom package 102 includes three dies 104, the bottom package 102 may include any other appropriate number of dies, e.g., one, two, four, or higher. The dies 104 are illustrated to be arranged in a side-by-side configuration in the bottom package 102—however, the dies 104 may be arranged in any other appropriate configuration. Merely as an example, two or more dies 104 may be stacked (e.g., vertically stacked on top of each other) within the package 102.

Interconnect structures 108 are disposed on a die-side surface of the substrate 106, and interconnect structures 122 are disposed on an opposite surface of the substrate 106. The interconnect structures 108, 122, for example, are solder bumps, metal pillars (e.g., copper pillars), balls formed using metals, ball grid array or pins, land grid array, pin grid array, alloys, solderable material, or the like. The interconnect structures, for example, are solder formed using metals, alloys, solderable material, and/or the like. For example, the interconnect structures 108 may comprise solder balls of any configuration formed on the dies 104 and/or the substrate 106 at appropriate locations (e.g., contact pads), e.g., so that when the dies 104 and the substrate 106 are placed together, the interconnect structures 108 can be melted or reflowed, thus physically and electrically connecting the dies 104 to the substrate 106. The interconnect structures 122 similarly are package interconnect structures used to electrically couple the substrate 106 to the substrate 140 (e.g., PCB or mother board).

Although not illustrated in FIG. 1, pads, electrically conductive vias, traces, redistribution layers, routing layers, interconnect bridges (e.g., an embedded multi-die interconnect bridge), etc. can be disposed on various layers of the substrate 106, thus providing electrical connection between the dies 104 and the interconnect structures 122, and/or among the dies 104. These electrical interconnections within and/or on the substrate 106 may comprise any appropriate electrically conductive materials, e.g., copper, gold, silver, aluminum, zinc, nickel, brass, bronze, iron, etc. In an example, the substrate 106 can include a core and multiple build-up layers, with each build-up layer including an interconnect level (e.g., a routing layer) for trace routing and a dielectric layer for electrically insulating laterally adjacent traces as well as adjacent interconnect levels. Conductive vias and solder connections can pass through the dielectric layer, such as to connect traces in different routing layers.

The substrate 140 may be, for instance, a printed circuit board (PCB) composed of an electrically insulative material such as an epoxy laminate. For example, the substrate 140 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown) such as traces, trenches, vias may be formed through the electrically insulating layers to route the electrical signals of the dies 104, 114 through the circuit board 140. The substrate 140 may be composed of other suitable materials in other embodiments. In some embodiments, the substrate 140 is a circuit board, a motherboard (e.g., motherboard 2002 of FIG. 7), an interposer, or the like. The substrate 140 is also referred to as a circuit board herein.

The dies 104, as described above, can include one or more integrated circuits, such as processors, memories, or other electrical components. As shown in FIG. 1, individual ones of the dies 104 has a first surface that confronts a surface of the substrate 106. The first surfaces of the dies 104 are physically and electrically coupled to the substrate 106, e.g., by the interconnect structures 108. Opposing second surfaces of one or more of the dies 104 faces the cooling arrangement 120, and are bonded to the cooling arrangement 120 via, for example, any appropriate thermally conductive bonding material 107.

The thermally conductive bonding material 107 can be implemented with any number of commercially available or proprietary thermal interface materials (or so-called TIMs), such as thermal grease, thermal adhesive, thermal gap filler, thermally conductive pad, thermal tape, thermal elastomers, phase change materials, graphite pads, curable gels, and solders having relatively high thermal conductivity, etc. (e.g., with K>2 W/m-K, or K>20 W/m-K, or >50 W/m-K, or higher). The thermally conductive bonding material 107 may comprise polymer filled with thermally conductive particles or a film or sheet of thermally conductive metal (e.g., TIM), and can smooth the surface topography (e.g., micron-scale bumps and depressions) of the second surface of the dies 104 facing the arrangement 120. By coating the surface topography of the second surfaces of the dies 104 by the thermally conductive bonding material 107, a proportion of surface area through which heat transfer can occur is increased. The bonding material 107 increases the rate at which heat is removed from the dies 104 to the cooling arrangement 120.

The top package 112 includes a substrate 116. The substrate 116 is populated with a number of integrated circuits in the form of one or more die, e.g., dies 114a, 114b, 114c, which are collectively and generally referred to as dies 114 in plural, and die 114 in singular. Although the top package 112 includes three dies 114, the bottom package 102 may include any other appropriate number of dies, e.g., one, two, four, or higher. The dies 114 are illustrated to be arranged in a side-by-side configuration in the top package 112—however, the dies 114 may be arranged in any other appropriate configuration. Merely as an example, two or more dies 114 may be stacked (e.g., vertically stacked on top of each other) within the package 112.

The substrate 116 can be similar to substrate 106, and the previous relevant discussion is equally applicable here. Any number of packaging types can be used for packaging substrates 108 and 116, including ceramic, glass, polymer, and composite packages.

Interconnect structures 118 are disposed on a die-side surface of the substrate 116. The interconnect structures 118 can be similar to interconnect structures 108, and the previous relevant discussion is equally applicable here. Any number of interconnect technologies can be used for interconnect structures 108 and 118, including for instance, flip-chip bumps, or ball grid arrays (BGAs).

The dies 114, as described above, can include one or more integrated circuits such as processors, memories, or any other electrical components. As shown in FIG. 1, individual ones of the dies 114 has a first surface that confronts a surface of the substrate 116. The first surfaces of the dies 114 are physically and electrically coupled to the substrate 116, e.g., by the interconnect structures 118. Opposing second surfaces of one or more of the dies 114 face the cooling arrangement 120, and are attached to the cooling arrangement 120 via, for example, any appropriate thermally conductive bonding material 117 (e.g., which may be similar to the thermally conductive bonding material 107, or different).

In some embodiments, a plurality of electrically conductive interconnect structures 130 (also referred to as interconnections 130) electrically couple the top package 112 and the bottom package 102. For example, the interconnections 130 extend from the substrate 106 to the substrate 116. Merely as an example, the top package 112 and the bottom package 102 transmit power, data, control signals, etc. amongst each other via the interconnections 130. The interconnections 130 comprise conductive material, such as metal. The cooling arrangement 120 is disposed laterally between the interconnections 130 (e.g., the interconnections 130 are along a periphery of the arrangement 120).

Although not illustrated in FIG. 1, sections of the top package 112 and/or sections of the bottom package 102 may be at least in part embedded or encapsulated by an encapsulant, such as a molding material. Merely as an example, molding material may be formed between the substrate 106 and one or more of the dies 104a, 104b, 104c, and may at least in part encapsulate the interconnect structures 108. Similarly, as an example, molding material may be formed between the substrate 116 and one or more of the dies 114a, 114b, 114c, and may at least in part encapsulate the interconnect structures 118. The molding material may also at least in part encapsulate one or more of the dies 104, 114. Any appropriate commercially available and/or proprietary molding materials can be used, which are sometimes called molding compounds or semiconductor mold compounds. Typical molding compounds include, for instance, epoxy resins, hardeners, and catalysts. A molding compound can be selected for a given application based on its properties, such as the glass transition temperature, thermal conductivity, coefficient of thermal expansion, flexural modulus, adhesion properties, and/or moisture absorption rate. In an example, the molding layer is added late in the process after the stacking and bonding is complete, and therefore does not cover the surfaces of the dies 104, 114 that are facing and abutting the cooling arrangement 120. However, in other embodiments, the mold material may be between the die 104, 114 and the cooling arrangement 120, assuming the mold material has suitable thermal conductivity.

Although not illustrated in FIG. 1, in an example, the interconnections 130 can also be encapsulated by a molding layer, or another appropriate insulating layer, e.g., to electrically isolate the interconnections 130 from each other, and/or to provide mechanical strength to the interconnections 130.

In an example, the top dies 114 communicate with the circuit board 140 via the interconnect structures 118, the substrate 116, the interconnections 130, the substrate 106, and the interconnect structures 122. In an example, the top dies 114 communicate with the bottom dies 104 via the interconnect structures 118, the substrate 116, the interconnections 130, the substrate 106, and the interconnect structures 108.

The cooling arrangement 120 can comprise appropriate arrangement to dissipate heat from the dies 114, 104. For example, the arrangement 120 form a common arrangement that dissipates heat from both the top package 112 and the bottom package 102. The cooling arrangement 120 will be discussed in further detail herein below.

The dies 104, 114 (also referred to as Integrated Circuit chip, chip, or IC chip) can be any appropriate type of dies, such as processors (e.g., central processing unit or CPU, graphics processing unit or GPU), memory (e.g., high bandwidth memory, or HBM), platform controller hub, communication die, voltage regulator, amplifiers, rectifiers, logic, or any other functional circuitry.

Figure 2:
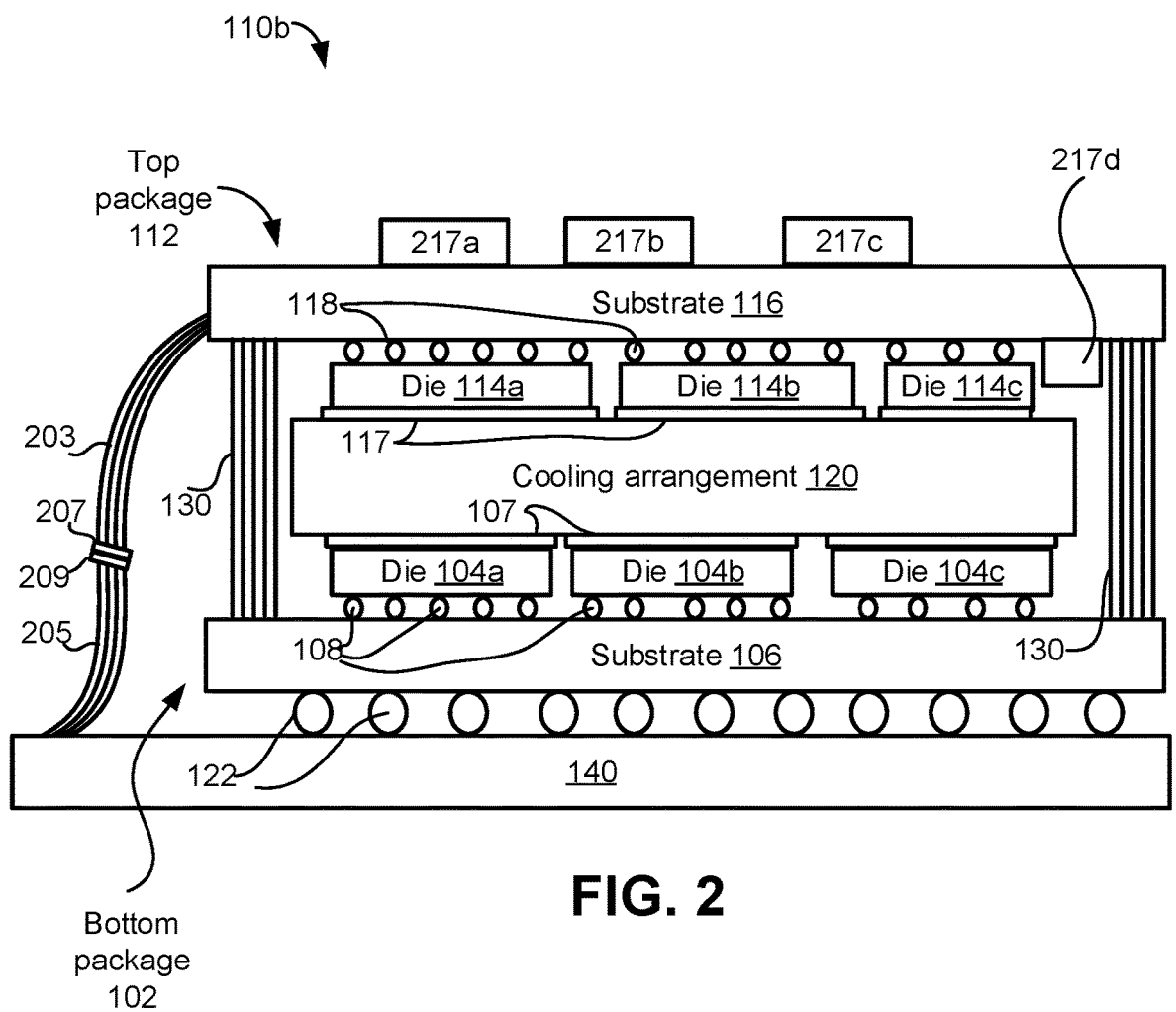
FIG. 2 illustrates a cross-sectional view of an integrated circuit structure that includes a shared cooling arrangement, where the cooling arrangement dissipates heat from one or more dies of a top package and from one or more dies of a bottom package, where the bottom package includes interconnect structures for coupling to a printed circuit board (PCB) or other substrate, and where the top package is coupled to the PCB via a connector arrangement, in accordance with an embodiment of the present disclosure.

Merely as an example, the dies 114 of the top package 112 comprises one or more memory modules, memory controller, and readout circuitry, and the dies 104 of the bottom package 102 comprises one or more processors (e.g., central processing unit, graphics processing unit, and co-processor). In another example, the dies 104 of the bottom package 102 comprise one or more dies associated with wireless communication (e.g., RF frontend circuitry such as RF filters, voltage regulators, and power amplifiers), the dies 114 of the top package 112 comprise one or more field-programmable gate arrays (FPGAs) or application specific integrated circuits (ASICs). In yet another example, dies 114 of the top package 112 include voltage regulators, and dies 104 of the bottom package 102 include components that consume voltages generated by the voltage regulators, e.g., as discussed in further details with respect to FIG. 2. This disclosure, however, is not limited by types of dies 104, 114, as will be appreciated FIG. 2 illustrates a cross-sectional view of an integrated circuit structure 100b (also referred to as structure 100b) that includes the cooling arrangement 120, where the arrangement 120 dissipate heat from one or more dies 114a, 114b, 114c of the top package 112 and from one or more dies 104a, 104b, 104c of the bottom package 102, and where the top package 112 is coupled to the circuit board 140 via ribbon cables 203, 205 and a connector arrangement, in accordance with an embodiment of the present disclosure. In the example of FIG. 2, the structure 100b is similar to the structure 100a of FIG. 1, and similar components in the structures in FIGS. 1 and 2 are illustrated using the same labels.

Additionally, in the structure 100b, substrate 116, and by extension the dies 114, are coupled to the circuit board 140 through flexible cables 203, 205. For example, a connector 207 is affixed to the cable 203, and a connector 209 is affixed to the cable 205. Also, the connectors 207 and 209 are mechanically coupled in the example of FIG. 2 (although the connectors 207, 209 can be decoupled as well), thereby establishing a direct connection (e.g., by bypassing the bottom package 102) between the top package 112 and the substrate 140. Each of the cables 203, 205 may be, as an example, insulated flexible cables having conductive metal wires or connections.

In an example, the structure 100b also includes one or more passive components 217a, 217b, 217c, and 217d, which are, for example, capacitors, resistors, and/or inductors. The passive components 217 may not heat significantly (e.g., may not heat as much as the dies 114, for example) and/or heating of the passive components 217 may not significantly affect the performance of the top package 112 (e.g., compared to an effect of heat generated by the dies 114). Accordingly, in an example, one or more of the passive components 217 may not be cooled using the arrangement 120. Thus, in an example, the passive components 217 may not abut or otherwise be in thermal contact with the cooling arrangement 120, as illustrated in FIG. 2. However, in another example, one or more of the passive components 217 may be thermally coupled to the arrangement 120 through a thermally conductive bonding material, and may be cooled by the arrangement 120. In an example, the passive components 217a, 217b, 217c are coupled to a side of the substrate 116 that is opposite the die attach side of the substrate 116. The passive component 217d may be, for example, coupled to the die attach side of the substrate 116 that faces the dies 114.

In an example embodiment, in the structure 100b, the dies 114 and passive components 217 comprise a standard or proprietary voltage regulator (VR) circuit. The VR receives an input voltage from the circuit board 140 by way of the cable-connector arrangement (203, 205, 207, 209), thereby bypassing the bottom package 102, outputs a regulated voltage. The regulated voltage can be supplied, for instance, to the bottom package 102 via the interconnections 130. Any number of voltage supply schemes can be used, as will be appreciated.

It is to be noted that various other examples and embodiments of this disclosure are depicted without the cabling-connector arrangement 203, 205, 207, 209 as shown in FIG. 2, but any such other example embodiments may also include such as arrangement, as will be appreciated.

Figure 3A:
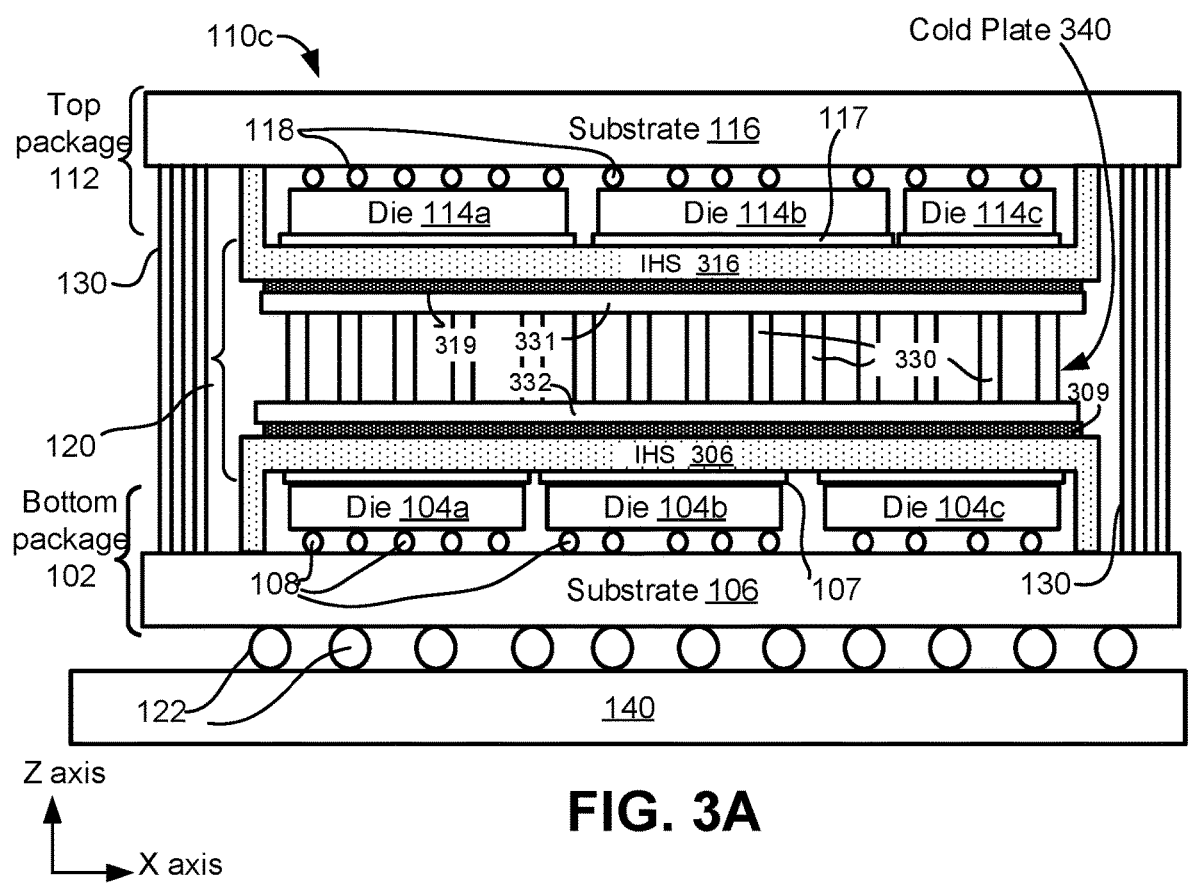
FIG. 3A illustrates a cross-sectional view of an integrated circuit structure that includes a shared cooling arrangement, where the cooling arrangement dissipates heat from one or more dies of a top package and from one or more dies of a bottom package, in accordance with another embodiment of the present disclosure.
Figure 3B:
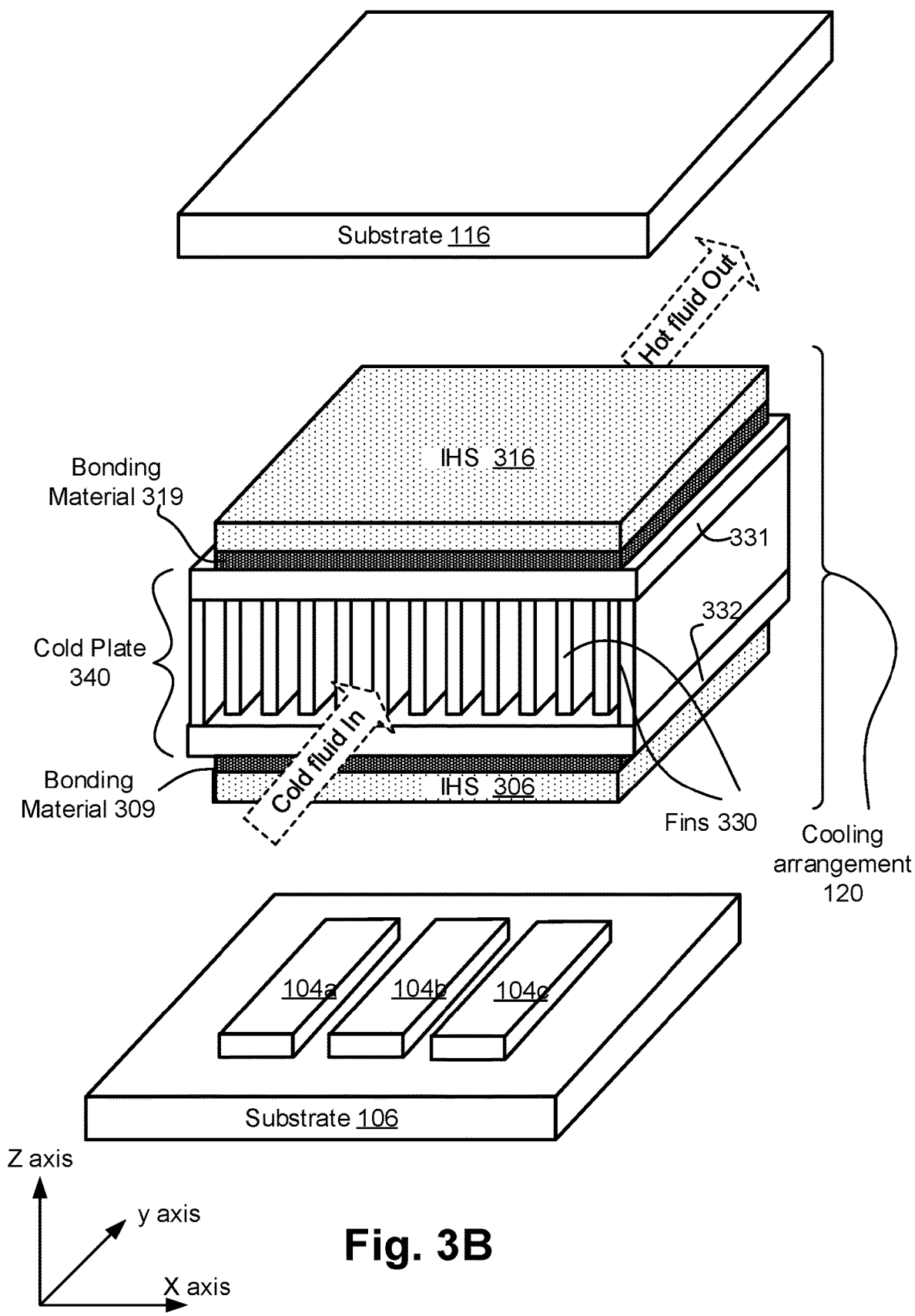
FIG. 3B illustrates an expanded view of the structure shown in FIG. 3A, and FIGS. 3C1-3C2 each illustrates a top down view of the structure shown in FIG. 3A.

FIG. 3A illustrates a cross-sectional view, FIG. 3B illustrates a perspective, partially separated view, and FIGS. 3C1-3C2 illustrate example top down views of integrated circuit structure 100c, where the cooling arrangement 120 comprises a cold plate 340, according to an embodiment. In addition, this example embodiment further includes integrated heat spreaders 306, 316. Various elements of the structure 100c of FIG. 3A are not illustrated in FIG. 3B, such as the interconnect structures 122, 108, 118, interconnections 130, and bonding material 107, 117. Also, the dies 114 are not visible in FIG. 3B, as the dies 114 are underneath the substrate 116. In the example top down views of FIGS. 3C1 and 3C2, the dies 114 are illustrated using dotted lines, as these will be underneath the substrate 116. Furthermore, in FIGS. 3C1 and 3C2, the bottom package 102 and the arrangement 120 are not visible. Also, although the vertical interconnections 130 are underneath the substrate 116 and hence will not be visible in the top view of FIGS. 3C1, 3C2, these interconnections 130 are nonetheless illustrated in these figures.

Also, three additional dies 114e, 114f, 114g attached to the substrate 116 are illustrated in the example of FIG. 3C1, such that the top package 112 has at least six dies. In the example of FIG. 3C2, the top package 112 has at least three dies 114a, 114b, 114c.

Referring to FIGS. 3A, 3B, 3C1, and 3C2, in some embodiments, the cooling arrangement 120 is thermally coupled to integrated heat spreader (IHS) 306, which is in turn thermally coupled to dies 104. Likewise, IHS 316 is thermally coupled between the dies 114 and the cold plate 340. The IHS 306 is bonded to the cold plate 340 via thermally conductive bonding material 309, and the IHS 316 is bonded to the cold plate 340 via thermally conductive bonding material 319. The thermally conductive bonding materials 309, 319 can be implemented with any number of commercially available or proprietary thermal interface materials (TIMs), such as thermal grease, thermal elastomers, phase change materials, graphite pads, curable gels, and solders having relatively high thermal conductivity. The present disclosure is not intended to be limited to any specific such bonding materials, as will be appreciated in light of this disclosure.

As can be seen with respect to FIGS. 3A and 3B, the cold plate 340 of this example embodiment comprises a plurality of channels defined by a plurality of fins 330. For example, each channel is defined by two adjacent fins 330. The fins 330 extend from an inlet of the channels to an outlet of the channels. The fins 330 are disposed between top plate 331 and bottom plate 332 of the cold plate 340. As illustrated in the perspective view of FIG. 3B, cold fluid enters the channels through the inlet, and hot fluid exits the channel through the outlet on the opposite side. In the cross-sectional view of FIG. 3A, the fluid would enter from the front of the page, and exit through the back of the page. The fins 330 are straight in the example of FIG. 3B, but in other example cases may be configured in a zig-zag shape, or a saw-shape, or other non-straight manner. Straight channels allow for fast flow rates, whereas non-straight channels are more disruptive to the flow and cause greater mixing of the coolant.

The width and height and shape of the channels can be tailored to provide a desired flow rate of the coolant fluid. In an example, the channels of the cold plate 340 are microchannels, e.g., provides relatively small flow passageways, for example, in the range of about 0.5 mm to 2 mm. In another example, a width of individual channel may be in the range of 0.5 mm to 5 mm, or 5 mm to 10 mm. In yet another example, a width of individual channels may be higher than 10 mm. As will be further appreciated, the width of the channels over certain sections of die 104, 114 can be different from the width of the channels over other sections of die 104, 114.

The materials can vary from one embodiment to the next, but in one example case, the fins 330, top plate 331, and bottom plate 331 are an appropriate thermally conductive material, metal such as copper, aluminum, or other high thermal conductivity material. Note that in some cases the fins 330 may be similar in geometry, while in other cases some fins may be wider or otherwise shaped differently to provide distinct flow patterns (suitable for a given application) within that same cold plate 340. Likewise, the channels may be similar in geometry, while in other cases some channels may be wider or otherwise shaped differently to provide distinct flow patterns (suitable for a given application).

Any appropriate coolant fluid may be used in the cold plate 340, such as air, water, an anti-freeze liquid, ethylene glycol, propylene, an appropriate non-ionic cooling fluid, and/or the like. The cooling fluid flowing through the channel structures pulls that heat out (or at least a portion of that heat) from the dies 114, 104, thereby helping to maintain a lower operating temperature of the dies 104, 114. The coolant fluid may be circulated through the channel via one or more fluid pumps (not illustrated in the figures, and may be external to the structure 100), for example. For example, the hot fluid exiting the cold plate 340 may be cooled (e.g., in a heat exchanger external to the structure 100, not illustrated), and circulated back in the cold plate 340.

As noted above, the channel structures can be tailored to provide flow rates that are customized to the cooling needs associated with a given area within a given semiconductor package. For example, if the die 114a dissipates more heat than the die 114c, the coolant fluid flow rate underneath the die 114a may be higher than that underneath the die 114c. For example, a channel underneath the die 114a may be relatively straight and wide, e.g., compared to a channel underneath the die 114c. Such customization may be useful if the overall flowrate to a given structure is constrained, or if one area of the structure 100 has higher thermal margin than another. In such cases, a channel structure that is associated with a low-power (low temperature) area within the structure 100 can be configured more narrowly to provide lower flow rate, which in some cases may in turn effectively provide extra flow rate budget that can be used elsewhere in the package.

Although FIGS. 3A-3C2 illustrate an example of a cold plate 340, the disclosure is not limited to this specific example of the cold plate 340, and any appropriate variations in the cold plate 340 may also be used. For example, the flow direction (whether air-based cooling or liquid-based cooling) for the channel structures can be the same so as to provide a parallel-flow arrangement (e.g., as seen in FIG. 3B), but in other example embodiments the flow direction for different channels are in different directions so as to provide a counter-flow arrangement to inhibit temperature stacking that may occur with parallel-flows. Numerous flow schemes can be used, as will be appreciated.

Figure 4A:
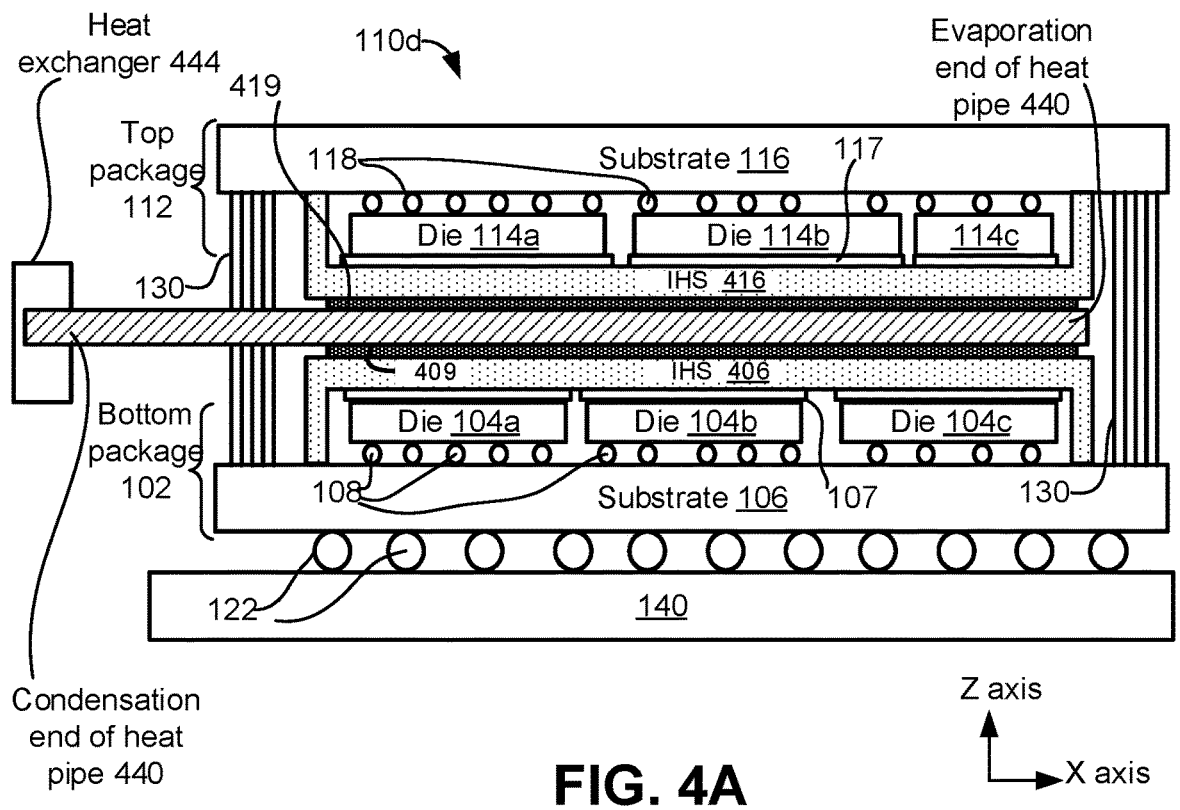
FIG. 4A illustrates a cross-sectional view of an integrated circuit structure that includes a shared cooling arrangement, where the cooling arrangement dissipates heat from one or more dies of a top package and from one or more dies of a bottom package, in accordance with another embodiment of the present disclosure.
Figure 4B:
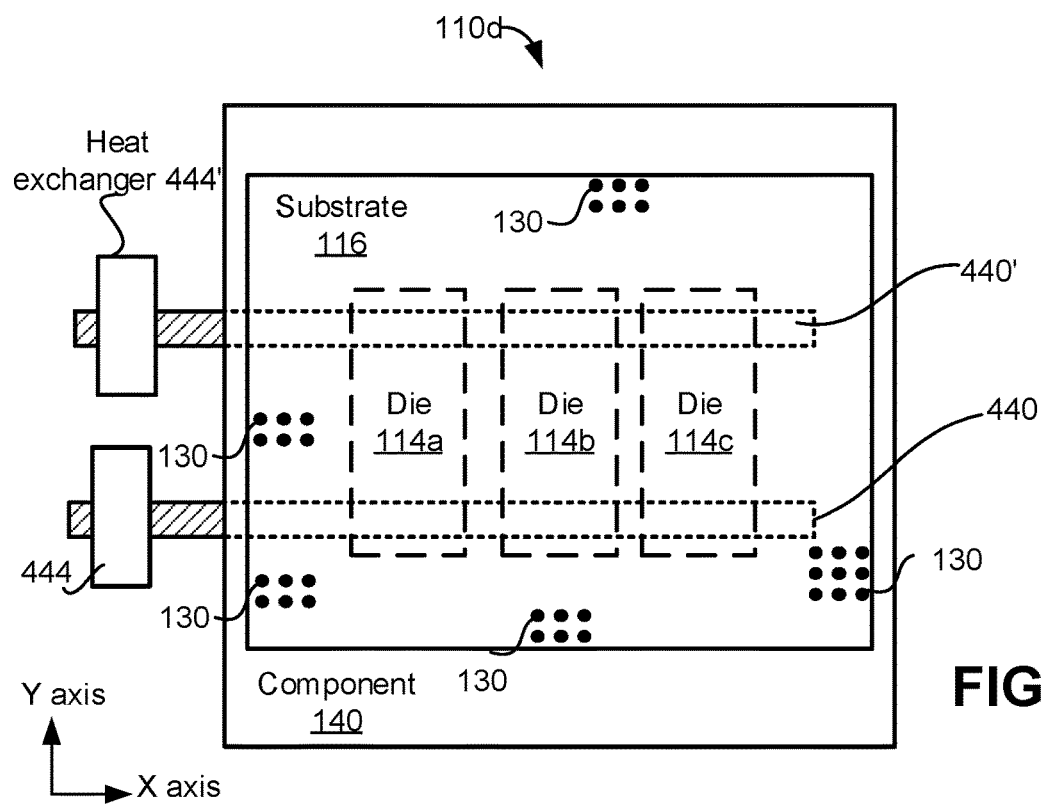
FIG. 4B illustrates a top down view of the structure shown in FIG. 4A.

FIG. 4A illustrates a cross-sectional view and FIG. 4B illustrates a top down view of the integrated circuit structure 100d, where the cooling arrangement 120 comprises a heat pipe 440, and integrated heat spreaders (IHS) 406, 416 further assist in the cooling scheme, in accordance with an embodiment of the present disclosure.

As can be seen, IHS 406 is thermally coupled between the dies 104 and the heat pipe 440, and IHS 416 is thermally coupled between the dies 114 and the heat pipe 440. The IHS 406 is bonded to the heat pipe 440 via thermally conductive bonding material 409, and the IHS 416 is bonded to the heat pipe 440 via thermally conductive bonding material 419. The thermally conductive bonding material 409, 419 can be implemented with any number of commercially available or proprietary thermal interface materials (or so-called TIMs), e.g., as discussed with respect to the thermally conductive bonding material 309, 319 of FIGS. 3A-3C2.

A heat pipe, such as the heat pipe 440 of FIG. 4A, is a passive heat transfer device. The heat pipe 440 has no moving parts, and effectively transfers heat away from heat sources, which are the dies 104, 114 in FIG. 4A. A working fluid inside the heat pipe 440 cycles through vapor and liquid states, thereby removing heat from the heat sources.

Although one heat pipe 440 is illustrated in the cross-sectional view of FIG. 4A, two or more such heat pipes may be present in the structure 100d, such as the heat pipe 440' and accompanying heat exchanger 444' illustrated in the top down view of FIG. 4B. Although FIG. 4B illustrate two heat pipes, more than two heat pipes may be present. In an example, the heat exchangers 444 and 444' may be combined in a single heat exchanger. The heat pipe 440 and the heat exchanger 444 are discussed in further details here, and such disclosure also applies to the heat pipe 440' and the heat exchanger 444'.

The heat pipe 440 is a sealed tube made from various metals, e.g., based on their thermal conductivity and the coolant used. The efficiency of the heat pipe improves as thermal conductivity of the heat pipe material increases. Example metals include, but are not limited, to copper and aluminum. The selection of the metal for the heat pipe may be based on the type of coolant used. For example, heat pipes made from copper or copper alloys may be used with a water phase change fluid, which may be less expensive and more efficient than other typical coolants. Aluminum heat pipes may also provide a cost advantage over copper heat pipes. However, water cannot be used as a coolant in aluminum heat pipes because hydrogen gas results from the interaction of water with the aluminum.

The heat pipe 404 also includes an appropriate coolant (e.g., also referred to as working fluid), such as water, water containing mixture, ethanol, acetone, an appropriate type of alcohol, and/or the like. The inside of the heat pipe 404 is typically at a low pressure, in some cases, nearing a vacuum. The amount and type of coolant and pressure inside the heat pipe 404 may be based on the operating temperatures of the dies 104, 114 that are intended to be reduced.

The heat pipe 404 includes an evaporation end disposed near the heat sources, such as the dies 104, 114. The heat pipe 404 also includes a condensation end, which is attached to a heat exchanger 444. Heat from the dies 104, 114 are transferred to the evaporation end of the heat pipe 404 (e.g., via the IHS 406, 416), causing the working fluid or coolant inside the heat pipe 440 to vaporize, thereby absorbing the latent heat and bringing down the temperature at the evaporation end. The vapor flows along the heat pipe 404 towards the condensation end, e.g., due to a pressure gradient caused by the vaporization. At the condensation end of the heat pipe 404, the vapor condenses (e.g., due to the cooling from the heat exchanger 444) back to liquid form, giving up latent heat of the vaporization.

Although not illustrated in FIGS. 4A-4B, the heat pipe 440 includes a wicking mechanism, such as a screen mesh, a sintered copper powder wick that may be made from a metal, such as copper, and/or the like. Other materials that may be used as the wick include fabrics, non-woven plastic fabrics, fiberglass, and the like. The wicking mechanism exerts a capillary pressure on the liquid coolant, thereby moving the liquid coolant from the condensation end back to the evaporation end. In an example, the heat pipe 440 may not use a wicking mechanism if another source of acceleration is provided to overcome the surface tension of the liquid coolant. For example, the condensation end may be tilted upwards, enabling the acceleration from gravity to move the liquid coolant back to the evaporation ends of the heat pipe 440.

The heat exchanger 444 removes heat from the condensation end of the heat pipe 440, helping to cool the condensation end and to condensate the coolant inside the heat pipe 440. Although not illustrated in FIGS. 4A-4B, the heat exchanger 444 may include one or more fans to provider higher airflow, e.g., to cool the condensation end. It is noted that, in some embodiments, the heat exchanger 444 may not include any fan. Although not illustrated in FIGS. 4A-4B, the heat exchanger 444 may also include fins, heat spreaders, and/or other structure to increase the surface area through which heat can dissipate, thereby cooling the condensation end of the heat pipe.

Figure 5:
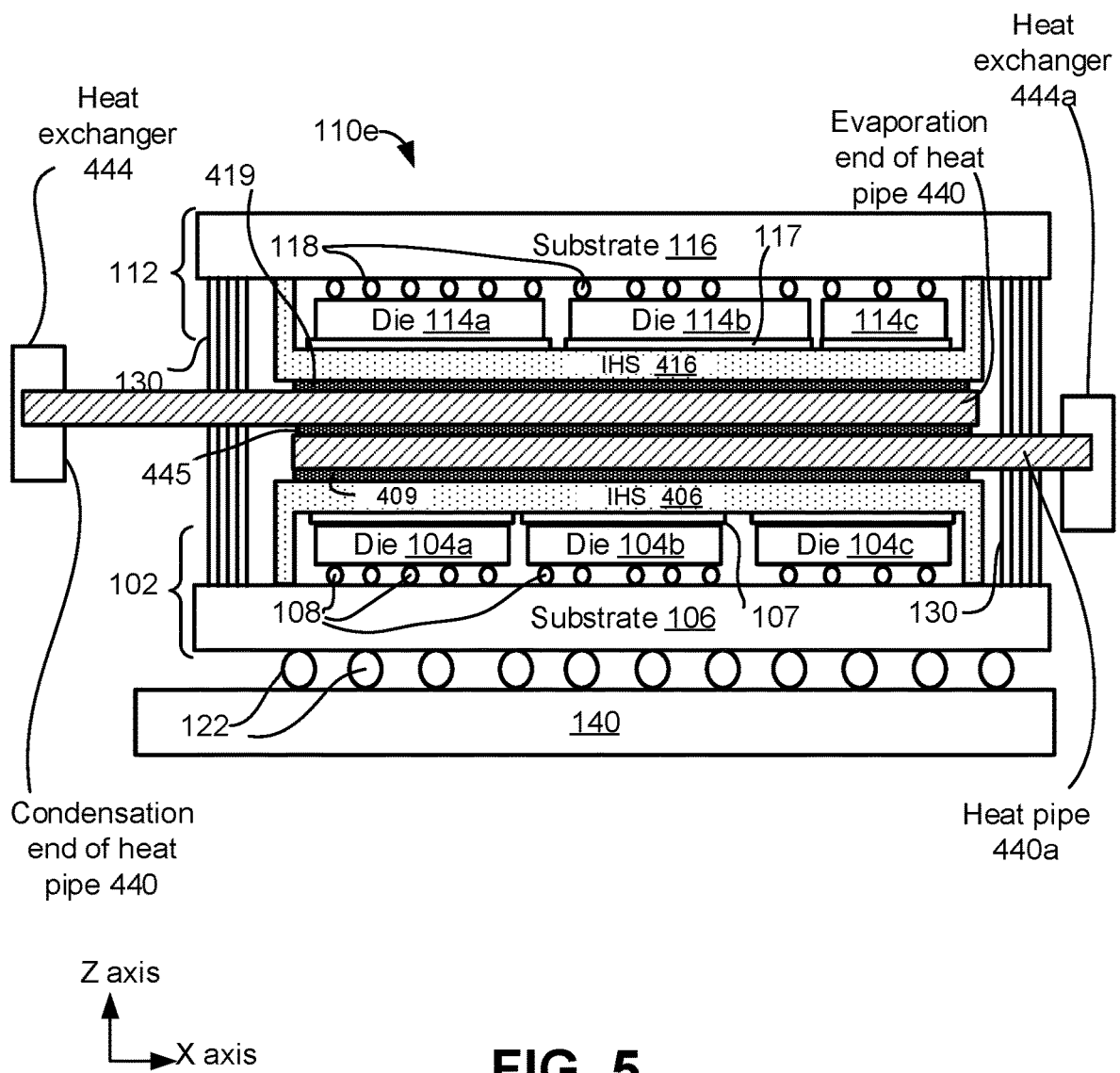
FIG. 5 illustrates a cross-sectional view of an integrated circuit structure that includes a shared cooling arrangement, where the cooling arrangement dissipates heat from one or more dies of a top package and from one or more dies of a bottom package, in accordance with another embodiment of the present disclosure.

FIG. 5 illustrates a cross-sectional view of the integrated circuit structure 100e, where the cooling arrangement 120 comprises a first heat pipe 440 to cool the top package 112, a second heat pipe 440a to cool the bottom package 102, in accordance with an embodiment of the present disclosure. The structure of FIG. 5 is at least in part similar to the structure 100d of FIGS. 4A-4B. However, unlike FIGS. 4A-4B, the structure 100e of FIG. 5 has a heat pipe 440 to cool the top package 112, and a heat pipe 440a to cool the bottom package 102. The condensation end of the heat pipe 440a is thermally coupled to a heat exchanger 444a, and the evaporation end of the heat pipe 440a is thermally coupled to the dies 104 of the bottom package 102. The condensation end of the heat pipe 440 is thermally coupled to the heat exchanger 444, and the evaporation end of the heat pipe 440 is thermally coupled to the dies 114 of the top package 112. Thus, in this example, the heat pipe 440 cools the dies 114 of the top package 112, and the heat pipe 440a cools the dies 104 of the bottom package 102. The heat pipes 440, 440a may be separated by an air gap (although the air gap is not illustrated in FIG. 5), and/or may be separated by a bonding material 445 (e.g., which may be similar to, or different from, the bonding material 409, 419).

Figure 6:
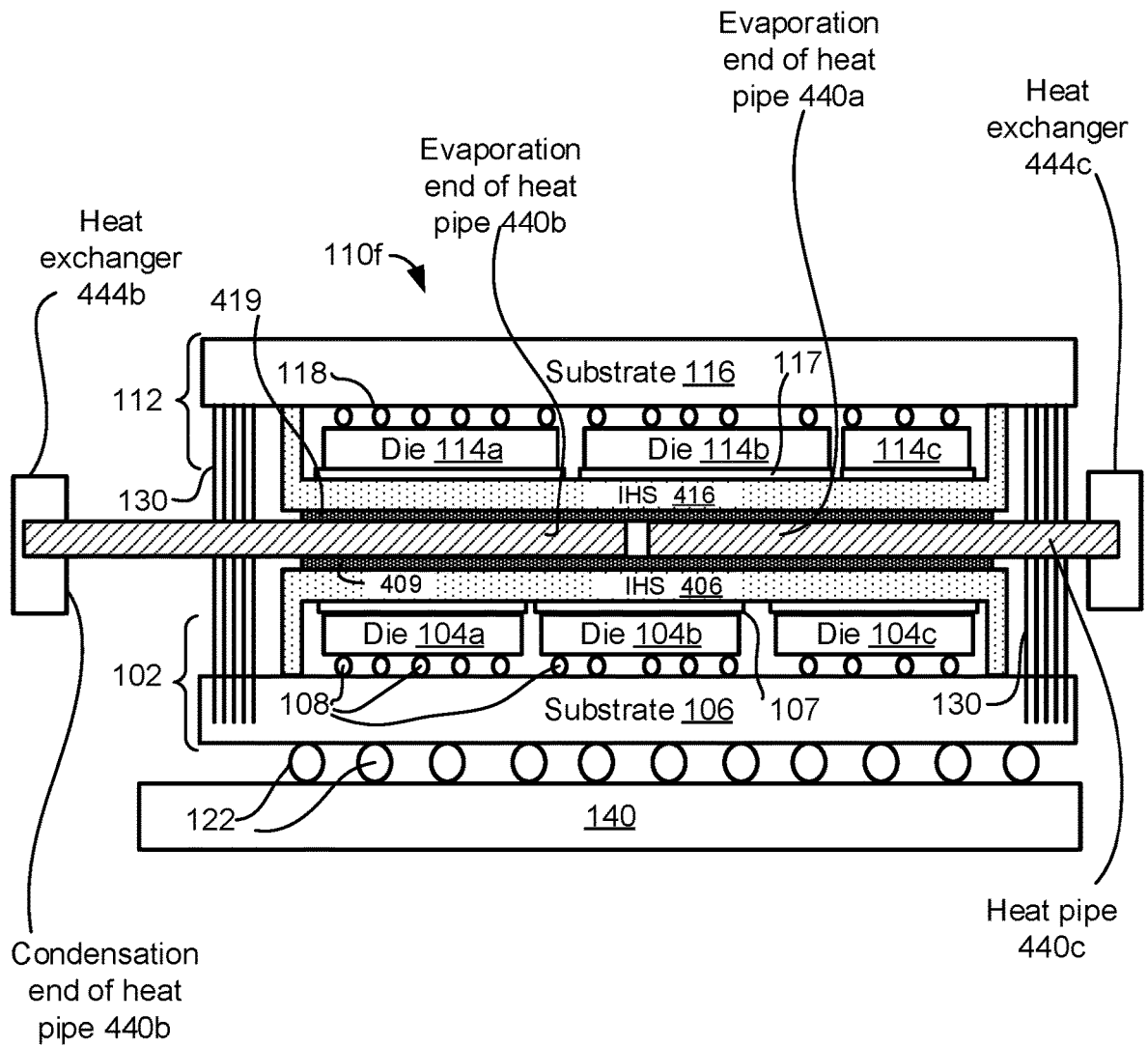
FIG. 6 illustrates a cross-sectional view of an integrated circuit structure that includes a shared cooling arrangement, where the cooling arrangement dissipates heat from one or more dies of a top package and from one or more dies of a bottom package, in accordance with another embodiment of the present disclosure.

FIG. 6 illustrates a cross-sectional view of the integrated circuit structure 100f, where the cooling arrangement 120 comprises a first heat pipe 440b cooling a first section of the top package 112 and the bottom package 102, and a second heat pipe 440c cooling a second section of the top package 112 and the bottom package 102, in accordance with an embodiment of the present disclosure. The structure of FIG. 6 is at least in part similar to the structure 100e of FIG. 5. However, unlike FIG. 5, in the structure 100f of FIG. 6, the heat pipe 440b cools a section of the top package 112 and a section of the bottom package 102, and the heat pipe 440c cools another section of the top package 112 and another section of the bottom package 102.

For example, the evaporation end of the heat pipe 440b is between the dies 114a, 104a, and cools these two dies. The evaporation end of the heat pipe 440b is also adjacent to a section of the die 114b and a section of the die 104b and cools these sections of the two dies. The evaporation end of the heat pipe 440c is between the dies 114c, 104c, and cools these two dies. The evaporation end of the heat pipe 440b is also adjacent to another section of the die 114b and another section of the die 104b and cools these sections of the two dies. The condensation end of the heat pipe 440b is thermally coupled to a heat exchanger 444b, and the condensation end of the heat pipe 440c is thermally coupled to a heat exchanger 444c, e.g., as discussed with respect to FIGS. 4A-4B and 5. The heat pipes 440b, 440c may be separated by an air gap, as illustrated in FIG. 6, and/or may be separated by a bonding material that is not illustrated in FIG. 6 (e.g., which may be similar to, or different from, the bonding material 409, 419). Although not illustrated in FIG. 6, the two heat pipes 440b, 440c may be combined to form a single heat pipe having two heat exchangers 444b, 444c on two ends of the combined heat pipe.

Referring to FIGS. 3A, 3B, 3C1, and 3C2, these figures illustrate examples of a cooling arrangement 120 comprising fluid cold plates. Referring to FIGS. 4A, 4B, 5, and 6, these figures illustrate examples of a cooling arrangement 120 comprising one or more heat pipes. In an example (and although not illustrated in the figures), the cooling arrangement 120 may use any other appropriate type of cooling techniques. Merely as an example, if the dies 104, 114 are designed to generate relatively less amount of heat during operation, then the cooling arrangement 120 may comprise heat spreaders, heat exchangers, fins, and/or other cooling mechanisms, without needing cooling arrangement such as cold plates with channels for coolant flow, heat pipes, etc. In another example, the heat pipes of FIGS. 4A-6 may be replaced by vapor chambers to transfer heat, as will be appreciated in light of this disclosure.

Referring now to FIGS. 1-6, illustrated and discussed are various examples and embodiments where a top package 112 and a bottom package 102 are vertically stacked over a circuit board 140, with a cooling arrangement 120 interposed between the top package 112 and the bottom package 102. The cooling arrangement 120 provides cooling to both the inverted top package 112 and the bottom package 102. The cooling arrangement 120 facilitates vertical stacking of two packages, where the two packages generate enough heat that necessitates some sort of cooling. The vertical stacking of die-facing packages 102, 112 helps reduce the lateral footprint on the circuit board 140, as well as the vertical footprint above the circuit board 140. The inversion of the top package 112 allows for an efficient and shared cooling scheme that has a low-Z profile.

Example System

Figure 7:
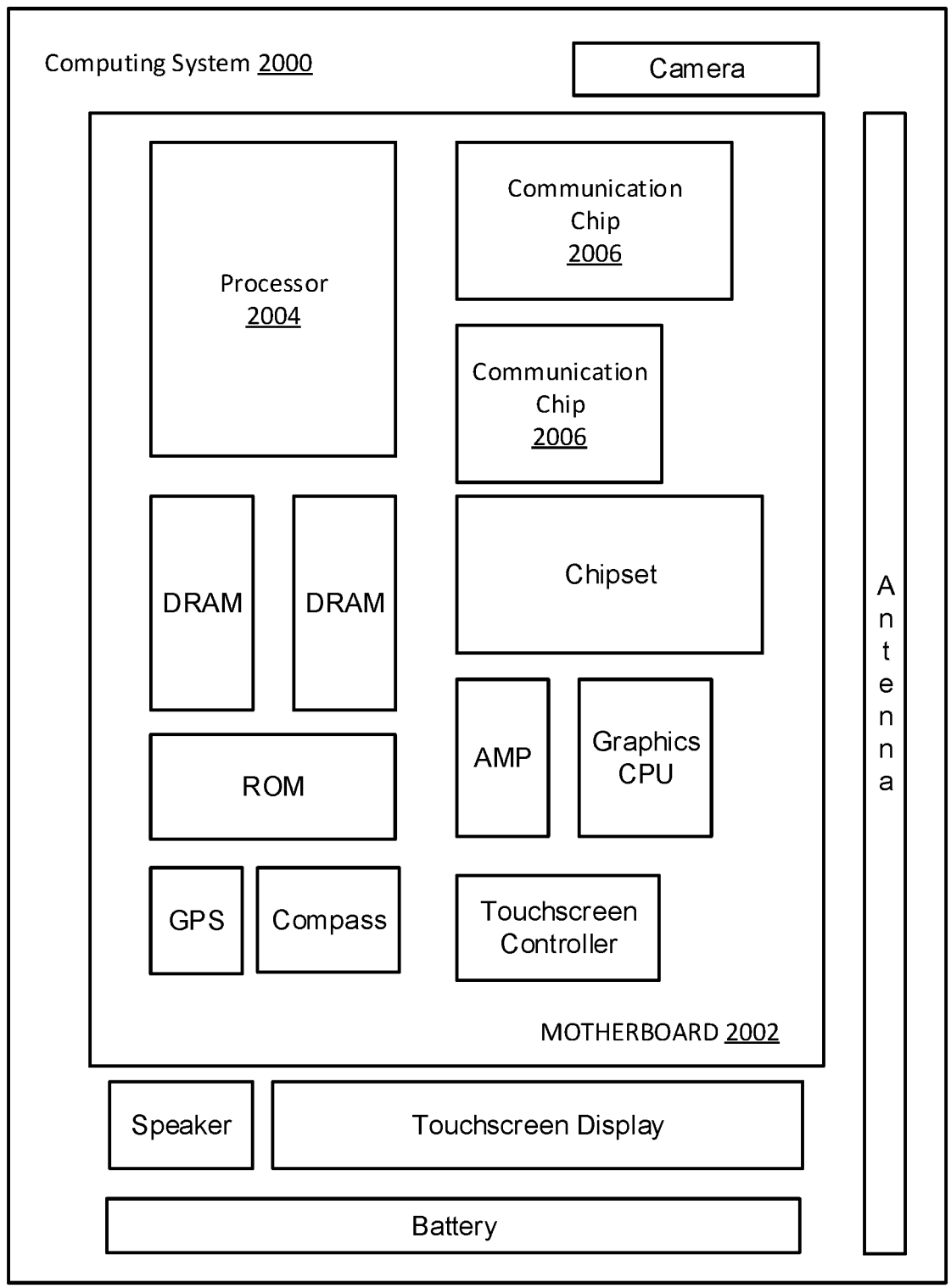
FIG. 7 illustrates a computing system implemented with integrated circuit structures formed using the techniques disclosed herein, in accordance with some embodiments of the present disclosure.

FIG. 7 is an example computing system implemented with one or more of the integrated circuit structures as disclosed herein, in accordance with some embodiments of the present disclosure. As can be seen, the computing system 2000 houses a motherboard 2002. The motherboard 2002 may include a number of components, including, but not limited to, a processor 2004 and at least one communication chip 2006, each of which can be physically and electrically coupled to the motherboard 2002, or otherwise integrated therein. As will be appreciated, the motherboard 2002 may be, for example, any printed circuit board, whether a main board, a daughterboard mounted on a main board, or the only board of system 2000, etc. In some such example embodiments, motherboard 2002 is substrate 140 as variously shown in FIGS. 1-6.

Depending on its applications, computing system 2000 may include one or more other components that may or may not be physically and electrically coupled to the motherboard 2002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 2000 may include one or more integrated circuit structures or devices configured in accordance with an example embodiment (e.g., first and second packages vertically stacked in a die-facing manner and having a shared cooling arrangement, as variously provided herein). In some embodiments, multiple functions can be integrated into one or more chips (e.g., for instance, note that the communication chip 2006 can be part of or otherwise integrated into the processor 2004).

The communication chip 2006 enables wireless communications for the transfer of data to and from the computing system 2000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 2000 may include a plurality of communication chips 2006. For instance, a first communication chip 2006 may be dedicated to shorter range wireless communications such as Wi-Fi and Bluetooth and a second communication chip 2006 may be dedicated to longer range wireless communications such as GPS, EDGE, GPRS, CDMA, WiMAX, LTE, Ev-DO, and others.

The processor 2004 of the computing system 2000 includes an integrated circuit die packaged within the processor 2004. In some embodiments, processor 2004 includes first and second packages vertically stacked in a die-facing manner and having a shared cooling arrangement, wherein a top die is inverted over a bottom die and the shared cooling mechanism pulls heat from both top and bottom die. The term "processor" may refer to any device or portion of a device that processes, for instance, electronic data from registers and/or memory to transform that electronic data into other electronic data that may be stored in registers and/or memory.

The communication chip 2006 also may include an integrated circuit die packaged within the communication chip 2006. In some embodiments, communication chip 2006 includes first and second packages vertically stacked in a die-facing manner and having a shared cooling arrangement, similar to the processor 2004. As will be appreciated in light of this disclosure, note that multi-standard wireless capability may be integrated directly into the processor 2004 (e.g., where functionality of any chips 2006 is integrated into processor 2004, rather than having separate communication chips). Further note that processor 2004 may be a chip set having such wireless capability. In short, any number of processor 2004 and/or communication chips 2006 can be used. Likewise, any one chip or chip set can have multiple functions integrated therein.

In various implementations, the computing system 2000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices, as variously described herein.

FURTHER EXAMPLE EMBODIMENTS

The following examples pertain to further embodiments, from which numerous permutations and configurations will be apparent.

Example 1. An integrated circuit structure comprising: a first integrated circuit package including a first die; a second integrated circuit package stacked above the first integrated circuit package and including a second die, wherein the second integrated circuit package is inverter such that the second die is facing the first die; and a cooling arrangement thermally coupled to each of the first and second die.

Example 2. The integrated circuit structure of example 1, further comprising one or more electrically conductive structures extending between the first integrated circuit package and the second integrated circuit package, wherein: the first integrated circuit package has a first side comprising a plurality of package interconnect structures to attach the first integrated circuit package to a circuit board; and the first integrated circuit package has an opposing second side facing the cooling arrangement, wherein the first die is attached to the second side of the first integrated circuit package.

Example 3. The integrated circuit structure of example 2, further comprising: a flexible cable attached to the second integrated circuit package, the flexible cable to communicatively couple the second integrated circuit package to the circuit board.

Example 4. The integrated circuit structure of example 3, wherein: the second die of the second integrated circuit package comprises a voltage regulator that is to receive a voltage from the circuit board through the flexible cable, and generate a regulated voltage; and the first die of the first integrated circuit package comprises a processor that is to receive the regulated voltage from the voltage regulator through the one or more electrically conductive structures.

Example 5. The integrated circuit structure of example 1, further comprising one or more electrically conductive structures extending between the first integrated circuit package and the second integrated circuit package, wherein the one or more electrically conductive structures are arranged around a periphery of the cooling arrangement and are at least in part encapsulated by a molding compound.

Example 6. The integrated circuit structure of any of examples 1-5, further comprising: a first heat spreader between the first die and at least a section of the cooling arrangement; and/or a second heat spreader between the second die and at least another section of the cooling arrangement.

Example 7. The integrated circuit structure of any of examples 1-6, wherein: a first side of the first die faces the first substrate, and an opposing second side of the first die faces the cooling arrangement and the second die; and a first side of the second die faces the second substrate, and an opposing second side of the second die faces the cooling arrangement and the first die.

Example 8. The integrated circuit structure of any of examples 1-7, further comprising: one or more passive devices above the second substrate, wherein the second substrate is between the one or more passive devices and the cooling arrangement.

Example 9. The integrated circuit structure of any of examples 1-8, wherein the cooling arrangement comprises: a cold plate comprising an inlet to receive coolant, an outlet from where the coolant is to exit the cold plate, and a plurality of channels between the inlet and the outlet for flow of the coolant, wherein the cold plate has a top side between the plurality of channels and the second integrated circuit package, and a bottom side between the plurality of channels and the first integrated circuit package.

Example 10. The integrated circuit structure of example 9, wherein at least one channel of the plurality of channels has a maximum width of 2 millimeters or less.

Example 11. The integrated circuit structure of any of examples 1-8, wherein the cooling arrangement comprises: a heat pipe having an evaporation end and a condensation end, wherein the evaporation end is between the first and second integrated circuit packages, and wherein the condensation end is attachable to a heat exchanger.

Example 12. The integrated circuit structure of any of examples 1-8, wherein the cooling arrangement comprises: a first heat pipe to transfer heat generated by the first die of the first integrated circuit package; and a second heat pipe to transfer heat generated by the second die of the second integrated circuit package.

Example 13. The integrated circuit structure of any of examples 1-12, wherein the first die of the first integrated circuit package comprises a processor, and the second die of the second integrated circuit package comprises a memory.

Example 14. A motherboard comprising the integrated circuit structure of any of examples 1-13.

Example 15. A computing system comprising the integrated circuit structure of any of examples 1-14.

Example 16. An apparatus including a microelectronics assembly, the apparatus comprising: a first microelectronics package having a first side and a second side, the first side attached to a plurality of package interconnect structures, and the second side having a first die thereon; a first heat spreader above the first die and thermally coupled to the first die; a cold plate arrangement above the first heat spreader and thermally coupled to the first heat spreader; a second heat spreader above the cold plate arrangement and thermally coupled to the cold plate arrangement; a second die above the second heat spreader and thermally coupled to the second heat spreader, the second die being part of a second microelectronics package.

Example 17. The apparatus of example 16, wherein the cold plate arrangement comprises: a top plate and a bottom plate; a plurality of fins extending from the top plate to the bottom plate; and a plurality of channels, wherein individual channel is defined by two adjacent fins of the plurality of fins, wherein the bottom plate is between the first heat spreader and the plurality of channels, and wherein the top plate is between the second heat spreader and the plurality of channels.

Example 18. The apparatus of any of examples 16-17, further comprising: one or more structures comprising metal encapsulated by insulator material, the one or more structures extending from the first microelectronics package to the second microelectronics package.

Example 19. The apparatus of any of examples 16-18, further comprising: a flexible cable having first and second connectors, the first connector attached to the second microelectronics package, the second connector attached to a printed circuit board, wherein the plurality of package interconnect structures are to be attached to the printed circuit board.

Example 20. The apparatus of any of examples 16-19, further comprising: one or more passive components above the second microelectronics package.

Example 21. An integrated circuit structure comprising: a first integrated circuit package including a first substrate having a first side and an opposing second side, one or more package interconnect structures on the first side of the first substrate, to couple the integrated circuit structure to a circuit board, and a first die having a first side attached to the second side of the first substrate, and an opposing second side; a second integrated circuit package including a second substrate, and a second die having a first side attached to the second substrate and an opposing second side; and a cooling arrangement between the first die and the second die, wherein the second side of the first die and the second side of the second die face the cooling arrangement and are thermally coupled to the cooling arrangement.

Example 22. The integrated circuit structure of example 21, further comprising: a first heat spreader comprising thermally conductive material between the first die and the cooling arrangement; and a second heat spreader comprising thermally conductive material between the second die and the cooling arrangement.

Example 23. The integrated circuit structure of any of examples 21-22, further comprising: one or more structures comprising electrically conductive material extending from the first substrate to the second substrate and arranged around a periphery of the cooling arrangement.

Example 24. The integrated circuit structure of example 23, further comprising: a layer comprising electrically non-conductive material encapsulating at least a section of the one or more structures.

Example 25. The integrated circuit structure of any of examples 21-24, wherein the cooling arrangement comprises a cold plate having a plurality of channels.

What is claimed is:

1. An integrated circuit structure comprising:
    a first integrated circuit package including a first plurality of dies;
    a second integrated circuit package stacked above the first integrated circuit package and including a second plurality of dies, wherein the second integrated circuit package is inverted such that the second plurality of dies is facing the first plurality of dies;
    a cooling arrangement thermally coupled to each of the first and second plurality of dies; and
    a plurality of electrically conductive structures extending between the first integrated circuit package and the second integrated circuit package, the plurality of electrically conductive structures laterally adjacent to both the first plurality of dies and the second plurality of dies, and the plurality of electrically conductive structures electrically coupling the first integrated circuit package to the second integrated circuit package.

2. The integrated circuit structure of claim 1, wherein the first integrated circuit package has a first side comprising a plurality of package interconnect structures to attach the first integrated circuit package to a circuit board; and the first integrated circuit package has an opposing second side facing the cooling arrangement, wherein the first plurality of dies is attached to the second side of the first integrated circuit package.

3. The integrated circuit structure of claim 2, further comprising:
    a flexible cable attached to the second integrated circuit package, the flexible cable to communicatively couple the second integrated circuit package to the circuit board.

4. The integrated circuit structure of claim 3, wherein the second plurality of dies of the second integrated circuit package comprises a voltage regulator that is to receive a voltage from the circuit board through the flexible cable, and generate a regulated voltage; and the first plurality of dies of the first integrated circuit package comprises a processor that is to receive the regulated voltage from the voltage regulator through the plurality of electrically conductive structures.

5. The integrated circuit structure of claim 1, wherein the plurality of electrically conductive structures are arranged around a periphery of the cooling arrangement and are at least in part encapsulated by a molding compound.

6. The integrated circuit structure of claim 1, further comprising:
    a first heat spreader between the first plurality of dies and at least a section of the cooling arrangement; and/or a second heat spreader between the second plurality of dies and at least another section of the cooling arrangement.

7. The integrated circuit structure of claim 1, wherein a first side of the first plurality of dies faces a first substrate, and an opposing second side of the first plurality of dies faces the cooling arrangement and the second plurality of dies; and a first side of the second plurality of dies faces a second substrate, and an opposing second side of the second plurality of dies faces the cooling arrangement and the first plurality of dies.

8. The integrated circuit structure of claim 7, further comprising:
    one or more passive devices above the second substrate, wherein the second substrate is between the one or more passive devices and the cooling arrangement.

9. The integrated circuit structure of claim 1, wherein the cooling arrangement comprises:
    a cold plate comprising an inlet to receive coolant, an outlet from where the coolant is to exit the cold plate, and a plurality of channels between the inlet and the outlet for flow of the coolant, wherein the cold plate has a top side between the plurality of channels and the second integrated circuit package, and a bottom side between the plurality of channels and the first integrated circuit package.

10. The integrated circuit structure of claim 9, wherein at least one channel of the plurality of channels has a maximum width of 2 millimeters or less.

11. The integrated circuit structure of claim 1, wherein the cooling arrangement comprises:
    a heat pipe having an evaporation end and a condensation end, wherein the evaporation end is between the first and second integrated circuit packages, and wherein the condensation end is attachable to a heat exchanger.

12. The integrated circuit structure of claim 1, wherein the cooling arrangement comprises:
    a first heat pipe to transfer heat generated by the first plurality of dies of the first integrated circuit package; and
    a second heat pipe to transfer heat generated by the second plurality of dies of the second integrated circuit package.

13. The integrated circuit structure of claim 1, wherein the first plurality of dies of the first integrated circuit package comprises a processor, and the second plurality of dies of the second integrated circuit package comprises a memory.

14. A motherboard comprising the integrated circuit structure of claim 1.

15. An apparatus including a microelectronics assembly, the apparatus comprising:
    a first microelectronics package having a first side and a second side, the first side attached to a plurality of package interconnect structures, and the second side having a first plurality of dies thereon;
    a first heat spreader above the first plurality of dies and thermally coupled to the first plurality of dies;
    a cold plate arrangement above the first heat spreader and thermally coupled to the first heat spreader;
    a second heat spreader above the cold plate arrangement and thermally coupled to the cold plate arrangement;
    a second plurality of dies above the second heat spreader and thermally coupled to the second heat spreader, the second plurality of dies being part of a second microelectronics package; and
    a plurality of electrically conductive structures extending between the first microelectronics package and the second microelectronics package, the plurality of electrically conductive structures laterally adjacent to both the first plurality of dies and the second plurality of dies, and the plurality of electrically conductive structures electrically coupling the first microelectronics package to the second microelectronics package.

16. The apparatus of claim 15, wherein the cold plate arrangement comprises:
a top plate and a bottom plate; a plurality of fins extending from the top plate to the bottom plate; and
a plurality of channels, wherein individual channel is defined by two adjacent fins of the plurality of fins, wherein the bottom plate is between the first heat spreader and the plurality of channels, and wherein the top plate is between the second heat spreader and the plurality of channels.

17. The apparatus of claim 15, further comprising:
one or more structures comprising metal encapsulated by insulator material, the one or more structures extending from the first microelectronics package to the second microelectronics package.

18. An integrated circuit structure comprising:
a first integrated circuit package including a first substrate having a first side and an opposing second side, one or more package interconnect structures on the first side of the first substrate, to couple the integrated circuit structure to a circuit board, and a first plurality of dies having a first side attached to the second side of the first substrate, and an opposing second side;
a second integrated circuit package including a second substrate, and a second plurality of dies having a first side attached to the second substrate and an opposing second side;
a cooling arrangement between the first plurality of dies and the second plurality of dies, wherein the second side of the first plurality of dies and the second side of the second plurality of dies face the cooling arrangement and are thermally coupled to the cooling arrangement; and
a plurality of structures comprising electrically conductive material extending between the first integrated circuit package and the second integrated circuit package, the plurality of structures comprising electrically conductive material laterally adjacent to both the first plurality of dies and the second plurality of dies, and the plurality of structures comprising electrically conductive material electrically coupling the first integrated circuit package to the second integrated circuit package.

19. The integrated circuit structure of claim 18, further comprising:
a first heat spreader comprising thermally conductive material between the first plurality of dies and the cooling arrangement; and
a second heat spreader comprising thermally conductive material between the second plurality of dies and the cooling arrangement.

20. The integrated circuit structure of claim 18, wherein the plurality of structures comprising electrically conductive material are arranged around a periphery of the cooling arrangement.

* * * * *